(12) United States Patent
Yamaguchi et al.

(10) Patent No.: US 9,297,973 B2
(45) Date of Patent: Mar. 29, 2016

(54) OPTICAL COUPLING DEVICE

(71) Applicant: KABUSHIKI KAISHA TOSHIBA, Tokyo (JP)

(72) Inventors: Taihei Yamaguchi, Fukuoka (JP); Masanori Yamada, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/670,071

(22) Filed: Mar. 26, 2015

(65) Prior Publication Data

US 2015/0198481 A1     Jul. 16, 2015

Related U.S. Application Data

(62) Division of application No. 14/016,006, filed on Aug. 30, 2013, now Pat. No. 9,104,002.

(30) Foreign Application Priority Data

Mar. 21, 2013 (JP) ................... 2013-059137

(51) Int. Cl.
*H01L 51/40* (2006.01)
*G02B 6/42* (2006.01)
*H01L 27/146* (2006.01)
*H01L 31/02* (2006.01)
*H01L 31/173* (2006.01)
*G01J 1/44* (2006.01)

(52) U.S. Cl.
CPC ................. *G02B 6/4295* (2013.01); *G01J 1/44* (2013.01); *H01L 27/14625* (2013.01); *H01L 31/02019* (2013.01); *H01L 31/173* (2013.01); *G01J 2001/4473* (2013.01)

(58) Field of Classification Search
CPC ..................... H01L 27/14625; H01L 31/0232; H01L 31/12
USPC ........................................... 257/83
See application file for complete search history.

(56) References Cited

U.S. PATENT DOCUMENTS 5,256,882 A   10/1993  Miyasaka
5,734,703 A   3/1998   Hiyoshi

FOREIGN PATENT DOCUMENTS

| JP | S63104384 A | 5/1988 |
| JP | H04304011 A | 10/1992 |
| JP | H05209788 A | 8/1993 |
| JP | 2004187168 A | 7/2004 |
| JP | 2006066614 A | 3/2006 |
| JP | 2009033142 A | 2/2009 |
| JP | 05226688 B2 | 7/2013 |

OTHER PUBLICATIONS

Japanese Office Action dated May 29, 2015, filed in Japanese counterpart Application No. 2013-059137, 9 pages (with translation).
Japanese Office Action dated Nov. 30, 2015, filed in Japanese counterpart Application No. 2013-059137, 10 pages (with translation).

*Primary Examiner* — Elias M Ullah
(74) *Attorney, Agent, or Firm* — Patterson & Sheridan, LLP

(57) ABSTRACT

A method for transmitting a signal using an optical coupling device includes converting a first electric signal into an optical signal, converting the optical signal into a first current, and outputting a second current that corresponds to the first current as a second electric signal. The second current may be larger than the first current.

15 Claims, 6 Drawing Sheets

OPTICAL COUPLING DEVICE

CROSS-REFERENCE TO RELATED APPLICATION

This application is a divisional of U.S. patent application Ser. No. 14/016,006, filed on Aug. 30, 2013, which is based upon and claims the benefit of priority from Japanese Patent Application No. 2013-059137, filed Mar. 21, 2013, the entire contents of each of which are incorporated herein by reference.

FIELD

Embodiments described herein relate generally to an optical coupling device.

BACKGROUND

An optical coupling device that can transmit a signal while its input terminal and output terminal are electrically insulated from each other, has become popular in electronic equipment that employs different types of power source systems, such as a DC power source system, an AC power source system, and a telephone line system. In such optical coupling devices, a transistor output photocoupler, in which a phototransistor is employed as a light receiving element, has wide versatility and wide applicability.

The optical coupling device is characterized by a current transmission rate (CTR), which indicates a current flowing into a light receiving element $I_C$ as a percentage of a current flowing into a light emitting element $I_F$. The current transmission rate of the optical coupling devices is required to have a wide range so that it can be used in different applications. Further, a switching time of the optical coupling devices is required to be small regardless of changes in the load resistance.

DETAILED DESCRIPTION

Embodiments provide an optical coupling device which can shorten a switching time while ensuring a wide range of current transmission rate, and which can be formed in a compact size.

In general, according to one embodiment, an optical coupling device includes a light emitting element configured to convert an electric signal into an optical signal, a photo transistor circuit configured to convert the optical signal into a current, the photo transistor circuit including a first transistor having a collector connected to a power source and an emitter through which the current is output, and a current mirror circuit. The current mirror circuit includes a second transistor having a collector connected to the emitter of the first transistor, a base connected to the emitter of the first transistor, and an emitter connected to a ground, and a third transistor having a collector connected to an output terminal, a base connected to the base of the second transistor, and a emitter connected to the ground.

Hereinafter, embodiments are explained in conjunction with drawings.

Figure 1:
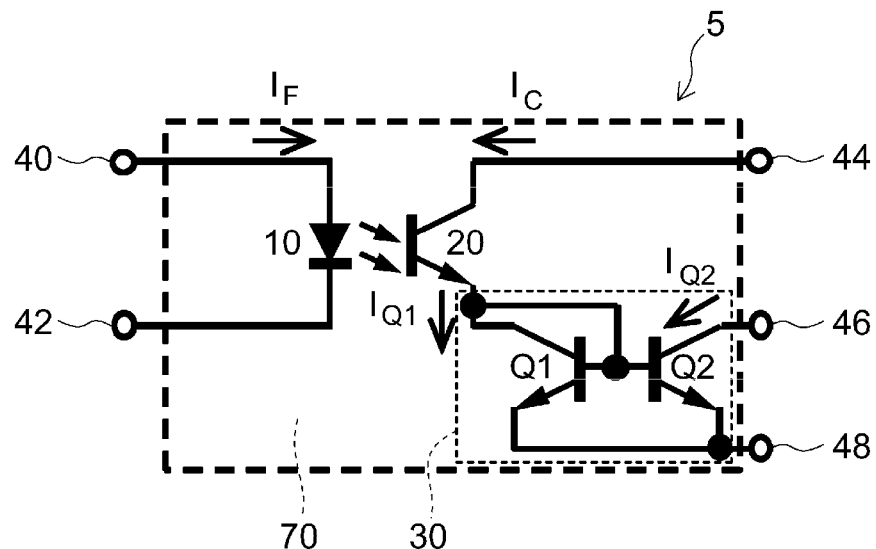
FIG. 1 is a schematic circuit diagram of an optical coupling device according to a first embodiment.

FIG. 1 is a schematic circuit diagram of an optical coupling device according to a first embodiment.

An optical coupling device 5 includes: a light emitting element 10; a phototransistor (light receiving element) 20; a current mirror circuit 30; a power source voltage terminal 44; an output terminal 46; and an output side ground terminal 48.

The optical coupling device 5 may also include an input terminal 40 and an input-side ground terminal 42.

The light emitting element 10 is connected to the first input terminal 40, and to one end portion of the input-side ground terminal 42 via a connecting wire or the like. The light emitting element 10 converts an input electric signal into an optical signal having a wavelength ranging from red light to infrared light.

The phototransistor 20 includes an emitter and a collector which is connected to the power source voltage terminal 44, and converts an optical signal into an electric signal. The phototransistor 20 has an npn junction or a pnp junction, and may have a vertical structure or a lateral structure.

The current mirror circuit 30 includes a first transistor Q1 and a second transistor Q2. In FIG. 1, each of the first and second transistors Q1 and Q2 is formed of a bipolar transistor. However, the first and second transistors Q1, Q2 may be formed of a MOSFET or the like.

The phototransistor 20 and the current mirror circuit 30 may be formed as a single chip. In such a light receiving circuit, a substrate made of Si may be used. With the use of the single-chip light receiving circuit, the optical coupling device 5 can be formed in a compact size. Further, assembling steps of the optical coupling device can be simplified.

An emitter current of the phototransistor 20 is input into the first transistor Q1 (IQ1). In the first transistor Q1, a base and a collector are connected to each other. In addition, a planner size of the second transistor Q2 is set to be n (n≥1) times as large as a planner size of the first transistor Q1. Due to such a setting of the planner sizes, the second transistor Q2 can output a collector current IQ2 which is n times as large as a collector current IQ1 of the first transistor Q1 from an output terminal 46. In this specification, the planner size of the bipolar transistor means an area of a collector-base bonding region.

The optical coupling device 5 may also include a resin molded body 70. The resin molded body 70 covers the light emitting element 10, the phototransistor 20, the current mirror circuit 30, one end portion of the power source voltage terminal wiring 44, one end portion of the output terminal wiring 46, one end portion of the output side ground terminal wiring 48, one end portion of the input terminal wiring 40, and one end portion of the input-side ground terminal wiring 42. Further, the other end portion of the power source voltage terminal wiring 44, the other end portion of the output terminal wiring 46, and the other end portion of the output side ground terminal wiring 48 project outwardly from the resin molded body 70 and are connected to a wiring part of a mounting printed circuit board.

In addition, a light transmitting resin layer may be provided to an optical path through which an optical signal from the light emitting element 10 is transferred toward the phototransistor 20. By disposing the resin molded body 70 such that it has a light blocking function and covers the light transmitting resin layer, the optical coupling device 5 can suppress an erroneous operation caused by an external disturbance light.

Figure 2:
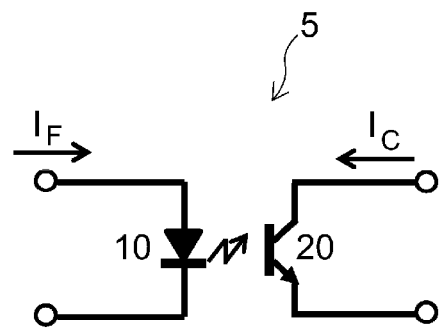
FIG. 2 is a schematic circuit diagram for explaining a current transmission rate.

FIG. 2 is schematic circuit diagram for explaining a definition of a current transfer ratio.

Assuming a forward current of the light emitting element 10 as $I_F$ and a collector current of the phototransistor 20 as $I_C$, the current transfer ratio CTR (%) of the optical coupling device 5 can be expressed by Equation (1).

$$CTR = I_C/I_F \times 100 (\%)$$ Equation (1)

Figure 3:
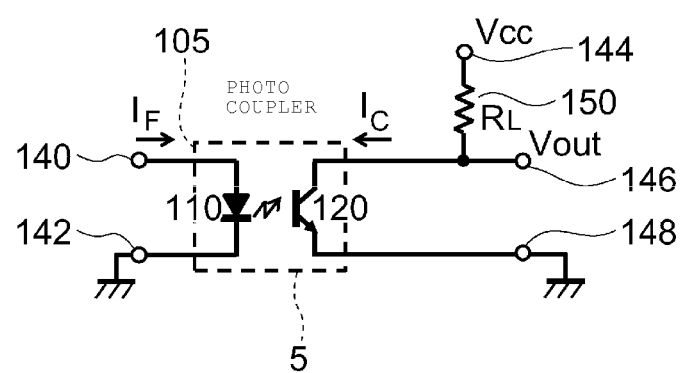
FIG. 3 is a schematic circuit diagram of an optical coupling device according to first and second comparison examples, that shows a load resistor connected to the optical coupling device.

FIG. 3 is a schematic circuit diagram of an optical coupling device 105 according to a comparison example where a load resistor is connected to the optical coupling device 105.

The load resistor (pull-up resistance) 150, which has a resistance RL, is connected between a collector of the phototransistor 120 and a power source voltage terminal 144.

Figure 4:
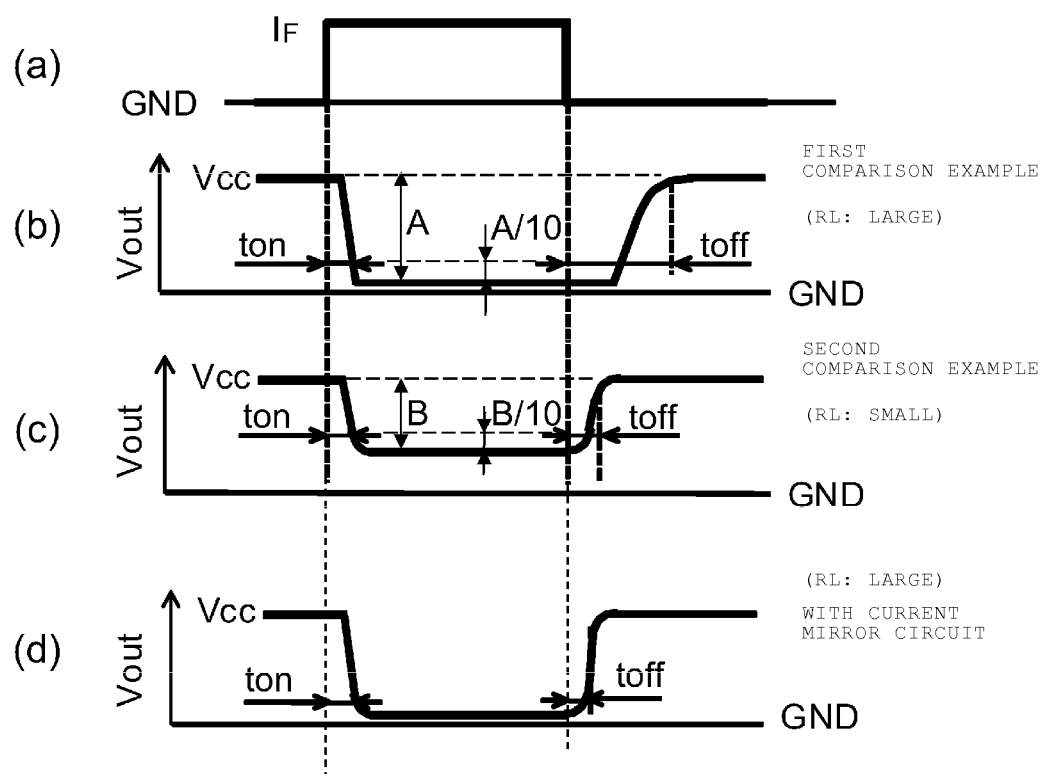
FIG. 4 is a waveform chart, wherein (a) shows a waveform of a forward current of a light emitting element, (b) shows a waveform of an output voltage of the optical coupling device according to the first comparison example in which a large load resistance is connected, (c) shows a waveform of an output voltage of the optical coupling device according to the second comparison example in which a small load resistance is connected, and (d) shows a waveform of an output voltage of the optical coupling device according to the first embodiment.

In FIG. 4, (a) shows a waveform of a forward current of a light emitting element, (b) shows a waveform of an output voltage of the optical coupling device according to the comparison example with a large load resistance, for example, 10 kΩ or more, (c) shows a waveform of an output voltage of the optical coupling device according to the second comparison example with a small load resistance, and (d) shows a waveform of an output voltage of the optical coupling device according to the first embodiment.

It is assumed that a forward current $I_F$ expressed by (a) of FIG. 4 flows into the light emitting element 10 as an input electric signal. In the first comparison example ((b) of FIG. 4) where the load resistance RL is large, a base of the phototransistor 20 is likely to be saturated with carriers so that an output voltage Vout at a low (L) level approximates a ground level GND.

However, when the phototransistor 20 is switched to an OFF state from an ON state, a large amount of carriers are stored in the base in a saturated state. In this example, because the load resistor 150 is connected to a current path, OFF-time toff taken to discharge the carriers is prolonged.

On the other hand, in the second comparison example ((c) of FIG. 4) where a resistance RL of the load resistor 150 is small, for example, 2 kΩ, a number of the carriers stored in a base is small, and hence the OFF time toff can be shortened. However, the base of the phototransistor 20 is hardly saturated. As a result, an output voltage Vout of L level floats from a ground level GND, and hence a noise margin in the transfer of the electric signal can be lowered.

Figure 5:
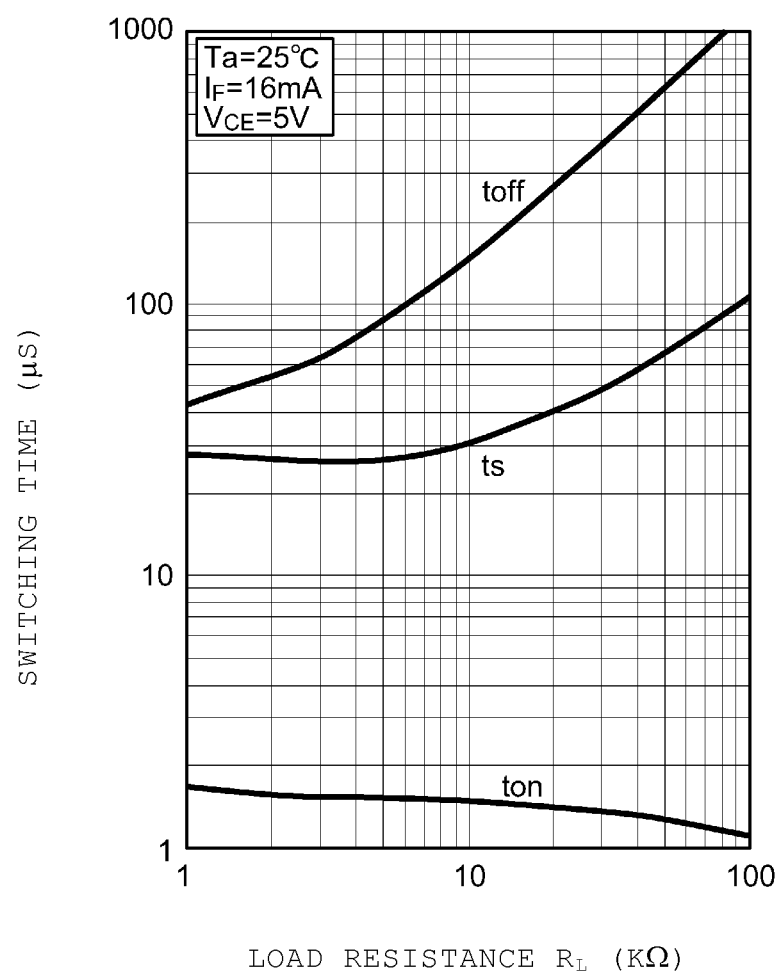
FIG. 5 is a graph showing correlation between a switching time and load resistance values with respect to the first and second comparison examples.

FIG. 5 is a graph expressing correlation between a load resistance RL and a switching time (a switching time toff, a switching time ton, and a storage time ts) with respect to the first and second comparison examples.

In FIG. 5, an axis of ordinate denotes a switching time (μs), and an axis of abscissa denotes a load resistance RL (kΩ). The switching times include the storage time ts, which is defined as a time period taken to discharge a base-emitter equivalent capacitance, the OFF time toff, and the ON time ton.

The ON time ton is defined as a time period between a rising edge of the input electric signal as shown in FIG. 4 (a) and a timing at which an output voltage Vout is lowered to a predetermined ratio (for example, 10%) with respect to the difference A between a power source voltage Vcc and a low level L of an output voltage Vout. The OFF time toff is defined as a time period between a falling edge of the input electric signal as shown in FIG. 4 (a) and a timing at which an output voltage Vout is elevated to a predetermined ratio (for example, 10%) with respect to the difference A between the power source voltage Vcc and the low level L of an output voltage Vout.

Although the storage time is and the OFF time toff are increased along with increase of the load resistance RL, the ON time ton does not change relative to the load resistance RL when compared to the OFF time toff. Here, it is assumed that a collector-emitter voltage $V_{CE}$ of the phototransistor is 5V, and that a forward current $I_F$ of the light emitting element is 16 mA.

To the contrary, in the first embodiment, as shown in (d) of FIG. 4, the load resistor is not connected to the current path of the phototransistor 20, and instead the current mirror circuit 30 is connected to the current path of the phototransistor 20. Accordingly, the saturation of the carriers is not generated in the phototransistor 20, and hence the OFF time toff can be reduced. Further, the output voltage Vout at a low level can be set to approximately a ground level GND regardless of the resistance RL of the load resistance.

In the first embodiment, by changing a ratio n of a planner size of the second transistor Q2 with respect to a planner size of the first transistor Q1, an output current of the current mirror circuit 30 can be set. For example, by setting the ratio n to 1 (n=1), the electric current IQ1 and the electric current IQ2 can be set approximately equal. By setting the ratio n to 2 (n=2), the electric current IQ2 can be set approximately twice as large as the electric current IQ1. In this manner, by changing the ratio n, the output current $I_C$ can be set. The current transferred ratio CTR can be set to a value ranging from 100% to 2000%, and hence the optical coupling device can be applicable in various ways. In this case, it is unnecessary to increase capacitance of the phototransistor 20, and hence the increase of the switching time can be suppressed.

The size of the phototransistor can be smaller than the size of a photodiode. Further, the size of the current mirror circuit 30 can be smaller than the size of the phototransistor. Even when a current mirror circuit, which is mounted on a package with the phototransistor 20 in the above-mentioned embodiment, is externally mounted on a mounting member separately from the phototransistor 20 mounted on the mounting member, the substantially same optical characteristic can be achieved. In the first embodiment, a load resistance can be increased while maintaining the short switching time, and hence the power consumption can be reduced.

Figure 6:
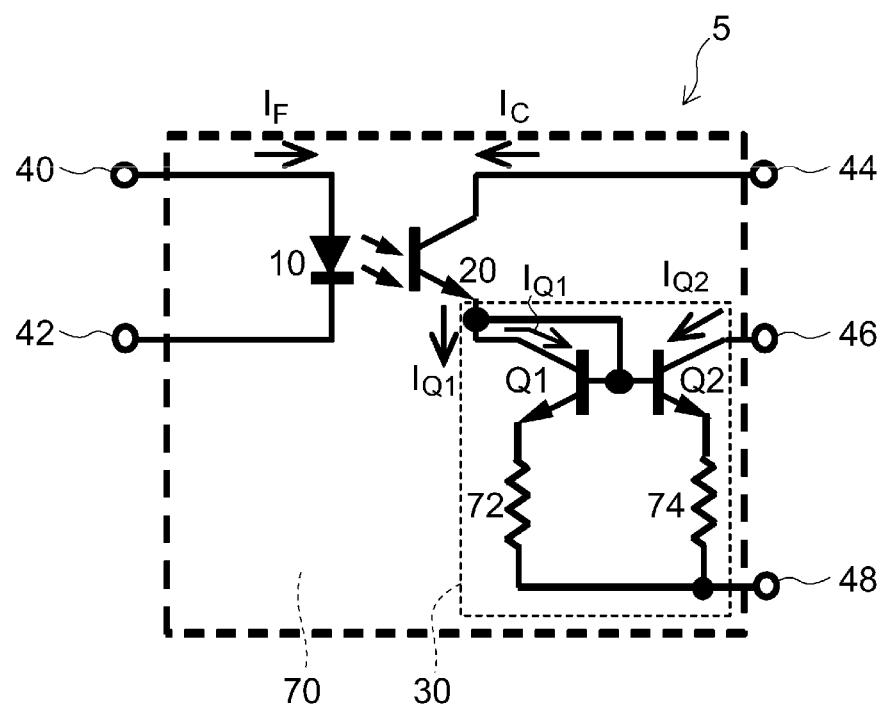
FIG. 6 is a schematic circuit diagram of an optical coupling device according to a second embodiment.

FIG. 6 is a schematic circuit diagram of an optical coupling device according to a second embodiment.

The optical coupling device 5 of the second embodiment further includes a first resistor 72, which is connected between an emitter of a first transistor Q1 and an output-side ground terminal 48, and a second resistor 74, which is connected between an emitter of a second transistor Q2 and the output-side ground terminal 48. By changing a resistance RQ1 of the first resistor 72 and a resistance RQ2 of the second resistor 74, a collector current IQ2 of the second transistor Q2 can be changed.

For example, when the ratio n is 1 (n=1) and the resistances RQ1, RQ2 of the first and the second resistors 72, 74 are set equal to with each other (RQ1=RQ2), the electric current IQ1 is approximately equal to the electric current IQ2. Further, when the ratio n is 1 (n=1) and the resistance RQ2 of the second resistor 74 is set equal to a half of the resistance RQ1 of the first resistor 72 (RQ2=RQ1/2), the electric current IQ2 is approximately twice as large as the electric current IQ1. In this manner, a range of the current transfer ratio CTR can be widely set.

Figure 7:
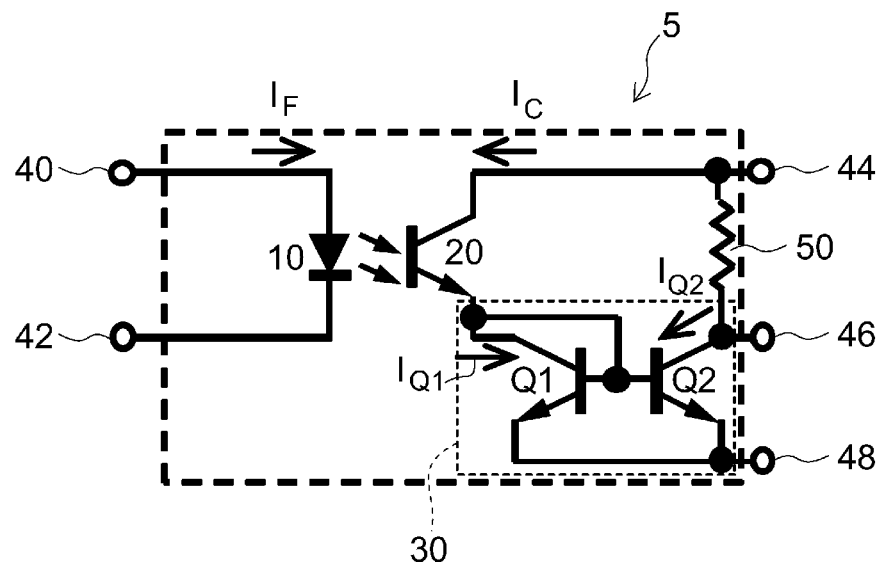
FIG. 7 is a schematic circuit diagram of an optical coupling device according to a third embodiment.

FIG. 7 is a schematic circuit diagram of an optical coupling device according to a third embodiment.

A load resistor 50 is mounted within a resin molded body 70 of the optical coupling device 5. The load resistor 50 is connected between a power source voltage terminal 44 and an output voltage terminal 46. In this case, a phototransistor 20, a current mirror circuit 30, and the load resistor 50 can be formed as a single chip. Accordingly, the optical coupling device 5 and electronic equipment can be easily miniaturized, the assembling step can be also simplified.

Figure 8:
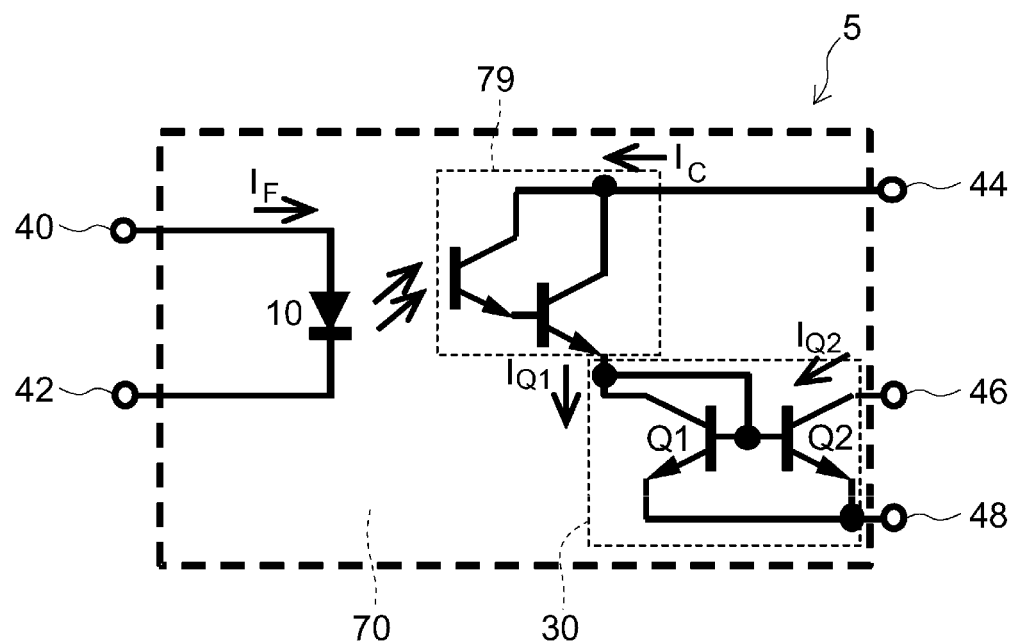
FIG. 8 is a schematic circuit diagram of an optical coupling device according to a fourth embodiment.

FIG. 8 is a schematic circuit diagram of an optical coupling device according to a fourth embodiment.

An emitter current of a phototransistor is input to a base of a bipolar transistor. That is, a phototransistor circuit 79 comprises a Darlington connection circuit. Accordingly, a current transfer ratio CTR can be enhanced more easily.

Figure 9:
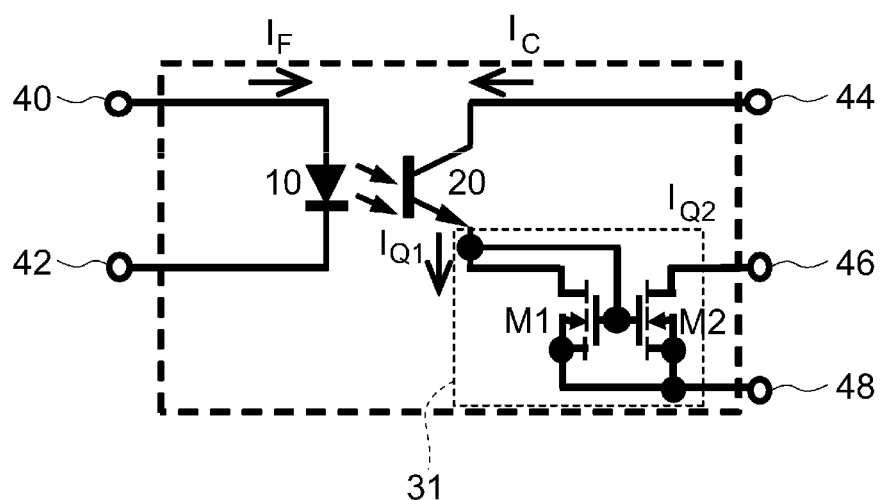
FIG. 9 is a schematic circuit diagram of an optical coupling device according to a fifth embodiment.

FIG. 9 is a schematic circuit diagram of an optical coupling device according to a fifth embodiment.

A current mirror circuit 31 may include a first transistor M1 and a second transistor M2, both of which are formed of an enhancement type MOSFET. Current mirror circuits formed of bipolar transistors may exhibit a large irregularity in a current uplifting ratio $h_{FE}$. Accordingly, irregularity in current transfer ratio CTR is also lager. According to an experiment carried out by inventors of the present disclosure, it is found that conformity in current transfer ratio CTR of optical coupling devices can be improved with the use of the current mirror circuit 31 formed of a MOSFET.

According to the optical coupling devices of the first to fifth embodiments, switching times ton, toff can be shortened while maintaining a wide range of current transfer ratio CTR, and the optical coupling device can be easily formed in a compact size. Such optical coupling devices can perform the transmission of signals in a state where an input terminal and an output terminal are electrically insulated from each other. Accordingly, the optical coupling devices can be widely used in electronic equipment having different power source systems such as a DC voltage system and an AC power source system and a telephone line system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for transmitting a signal using an optical coupling device, comprising:
converting a first electric signal into an optical signal;
converting the optical signal into a first current; and
outputting a second current that corresponds to the first current as a second electric signal, wherein
the optical coupling device includes a photo transistor circuit including a first transistor having a collector connected to a power source and an emitter through which a current is output, and
the optical signal is converted into the first current by the photo transistor circuit.

2. The method according to claim 1, wherein
the second current is larger than the first current.

3. The method according to claim 1, wherein
the second current is output using a current mirror circuit.

4. The method according to claim 1, wherein
the collector of the first transistor is directly connected to the power source.

5. The method according to claim 1, wherein
the optical coupling device further includes a current mirror circuit having a second transistor having a collector, a base connected to the collector, and an emitter connected to ground, and a third transistor having a collector connected to an output terminal, a base connected to the base of the second transistor, and an emitter connected to the ground,
the first current flows into the collector of the second transistor, and
the second current flows into the collector of the third transistor from the output terminal.

6. The method according to claim 5, wherein
the collector of the second transistor is directly connected to the emitter of the first transistor, the base of the second transistor is directly connected to the emitter of the first transistor, and the base of the third transistor is directly connected to the base of the second transistor.

7. The method according to claim 5, wherein
a resistor is connected between the power source and the output terminal.

8. The method according to claim 5, wherein
a first resistor is connected between the emitter of the second transistor and the ground; and
a second resistor is connected between the emitter of the first transistor and the ground.

9. The method according to claim 8, wherein
a resistance of the second transistor is larger than a resistance of the first resistor.

10. The method according to claim 1, wherein
the photo transistor circuit comprises a Darlington connection circuit.

11. The method according to claim 1, wherein
the optical coupling device includes a current mirror circuit having a second transistor having a drain, a gate connected to the drain, and a source connected to ground, and a third transistor having a drain connected to an output terminal, a gate connected to the gate of the second transistor, and a source connected to the ground,
the first current flows into the drain of the second transistor, and
the second current flows into the drain of the third transistor from the output terminal.

12. The method according to claim 11, wherein
the drain of the second transistor is directly connected to the emitter of the first transistor, the gate of the second transistor is directly connected to the emitter of the first transistor, and the gate of the third transistor is directly connected to the gate of the second transistor.

13. The method according to claim 11, wherein
a resistor is connected between the power source and the output terminal.

14. The method according to claim 11, wherein
a first resistor is connected between the emitter of the second transistor and the ground; and
a second resistor is connected between the emitter of the first transistor and the ground.

15. The method according to claim 14, wherein
a resistance of the second transistor is larger than a resistance of the first resistor.

* * * * *